(12) United States Patent
Tashiro

(10) Patent No.: US 12,412,622 B2
(45) Date of Patent: Sep. 9, 2025

(54) MEMORY DEVICE

(71) Applicant: Kioxia Corporation, Tokyo (JP)

(72) Inventor: Kenya Tashiro, Fujisawa Kanagawa (JP)

(73) Assignee: Kioxia Corporation, Tokyo (JP)

( * ) Notice: Subject to any disclaimer, the term of this patent is extended or adjusted under 35 U.S.C. 154(b) by 195 days.

(21) Appl. No.: 18/459,066

(22) Filed: Aug. 31, 2023

(65) Prior Publication Data

US 2024/0203484 A1 Jun. 20, 2024

(30) Foreign Application Priority Data

Dec. 20, 2022 (JP) .................. 2022-203384

(51) Int. Cl.
*G11C 11/4091* (2006.01)
*G11C 11/4076* (2006.01)
*G11C 11/4096* (2006.01)

(52) U.S. Cl.
CPC ...... *G11C 11/4096* (2013.01); *G11C 11/4076* (2013.01); *G11C 11/4091* (2013.01)

(58) Field of Classification Search
CPC ............ G11C 11/4096; G11C 11/4076; G11C 11/4091
See application file for complete search history.

(56) References Cited

U.S. PATENT DOCUMENTS

| 9,202,531 | B2 | 12/2015 | Seo | |
|---|---|---|---|---|
| 11,996,138 | B2* | 5/2024 | Wada | G11C 11/4076 |
| 2006/0092731 | A1* | 5/2006 | Kang | G11C 11/4091 365/203 |
| 2020/0075065 | A1* | 3/2020 | Jeong | H03F 1/0205 |
| 2023/0036684 | A1* | 2/2023 | Jung | G11C 11/4093 |
| 2023/0071414 | A1* | 3/2023 | Chi | G11C 7/06 |
| 2023/0402088 | A1* | 12/2023 | Wada | G11C 11/4091 |

FOREIGN PATENT DOCUMENTS

| JP | H07-302497 | A | 11/1995 |
|---|---|---|---|
| JP | 2010-146689 | A | 7/2010 |

* cited by examiner

*Primary Examiner* — Min Huang
(74) *Attorney, Agent, or Firm* — Foley & Lardner LLP

(57) ABSTRACT

A first inverter circuit including second and third transistors coupled at a third node and a second inverter circuit including fourth and fifth transistors coupled at a fourth node are coupled between first and second nodes. An eighth transistor is coupled between a gate of the third transistor and the third node. A ninth transistor is coupled between a gate of the fifth transistor and the fourth node. A state in which first and second voltages are applied to the first and second nodes is formed at a first time. A third voltage is applied to the first node at a second time. A fourth voltage is applied to the second node at a third time. The second voltage is applied to the second node at a fourth time. The first voltage is applied to the first node at a fifth time.

15 Claims, 11 Drawing Sheets

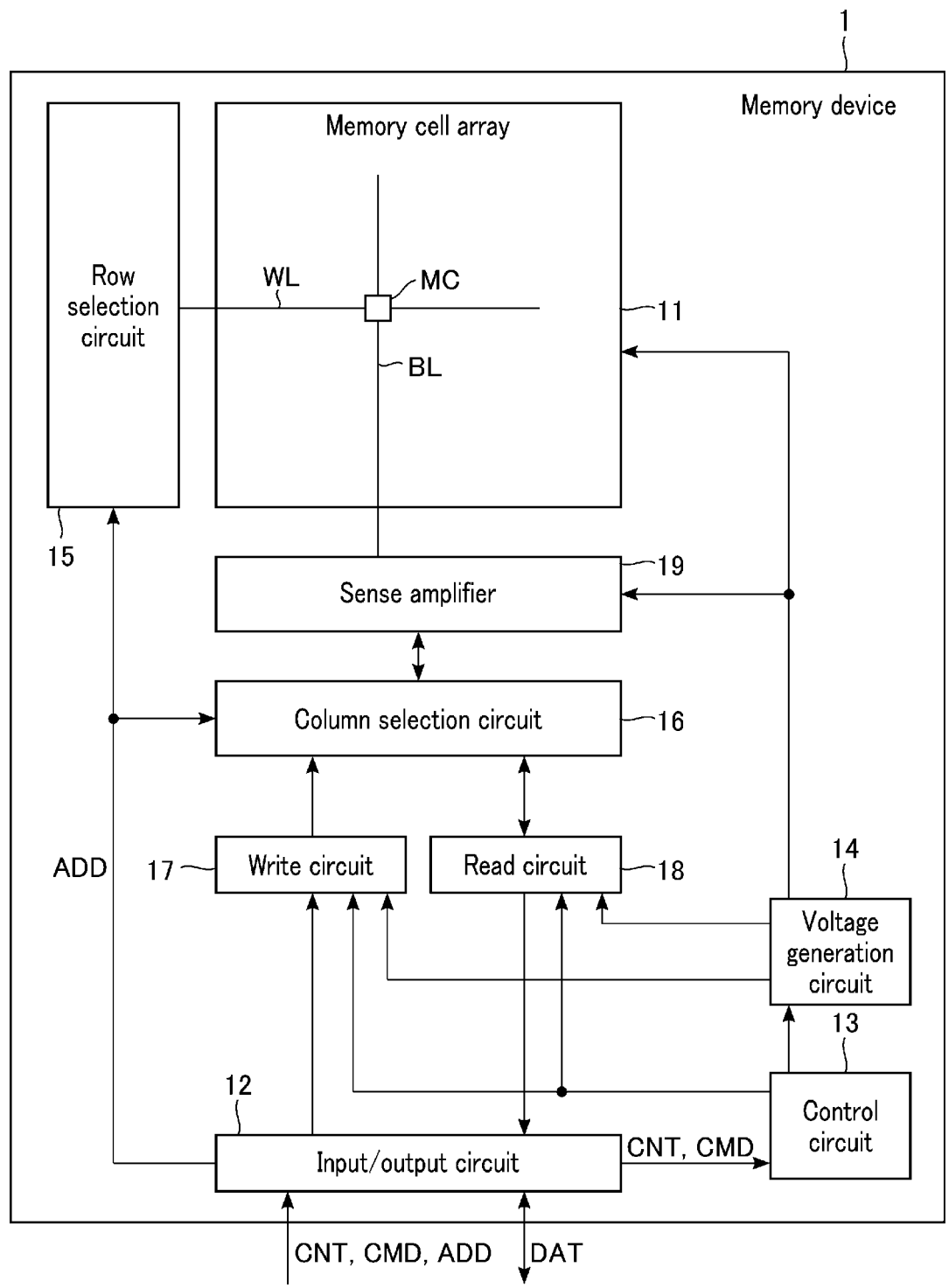
F I G. 1

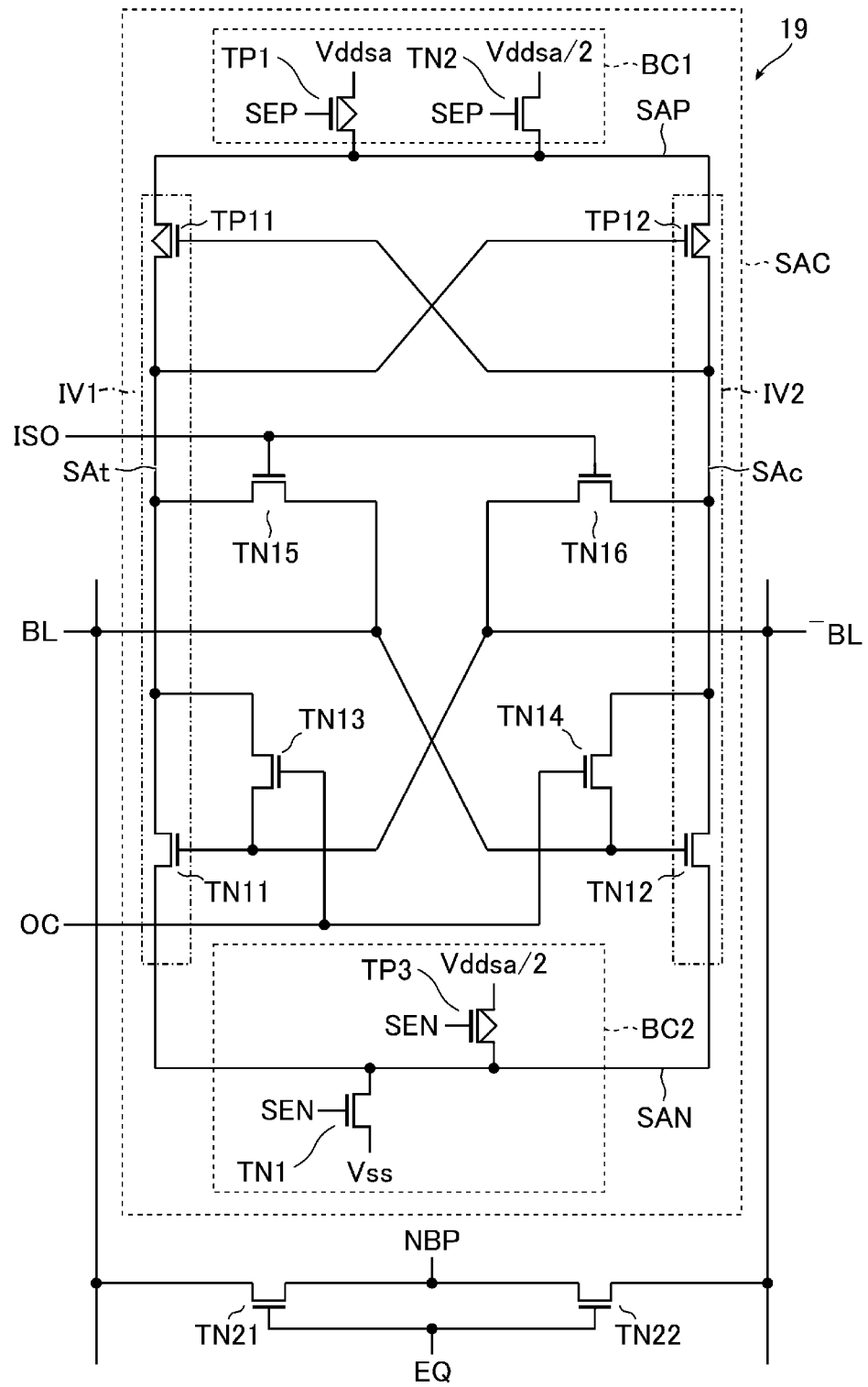
F I G. 3

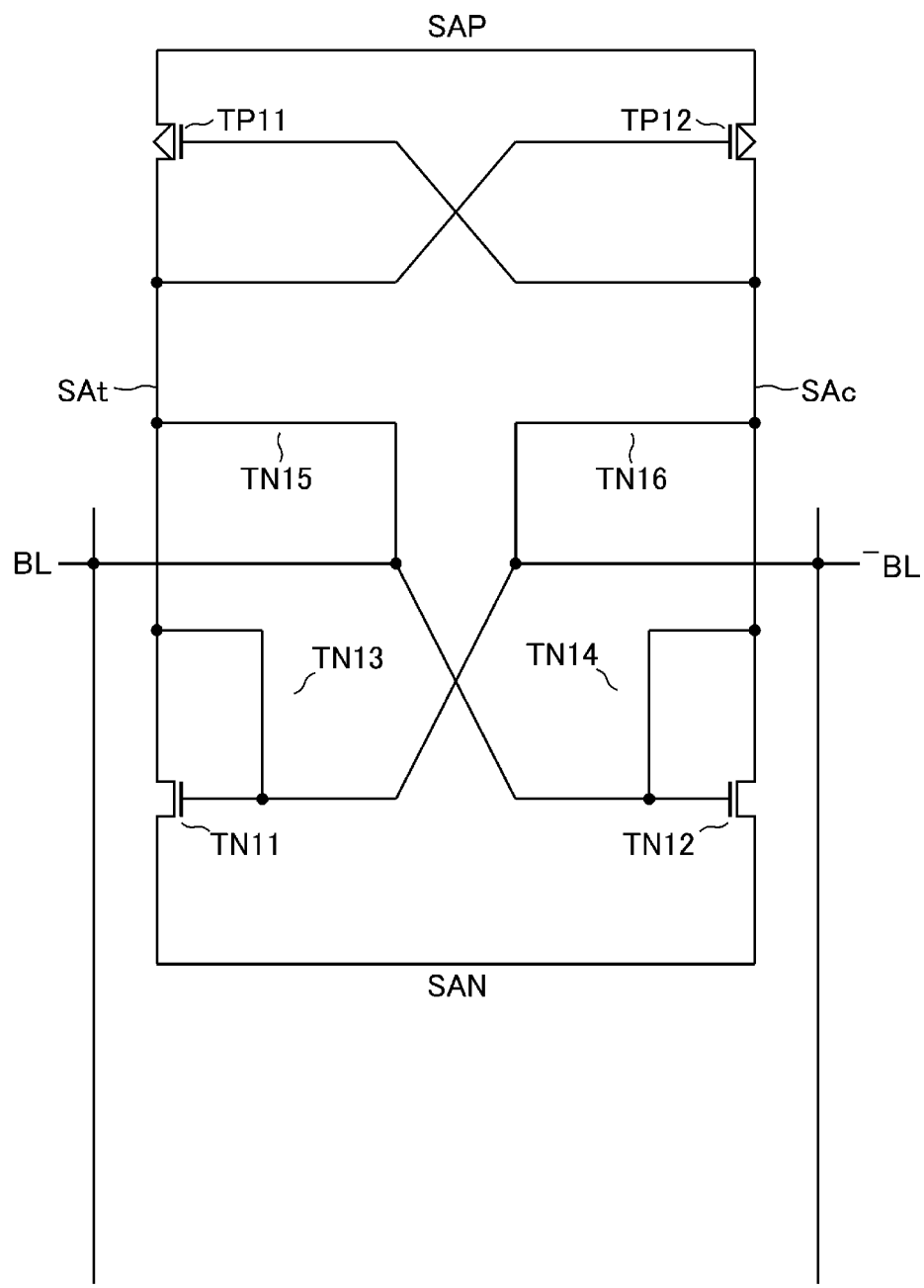
F I G. 8

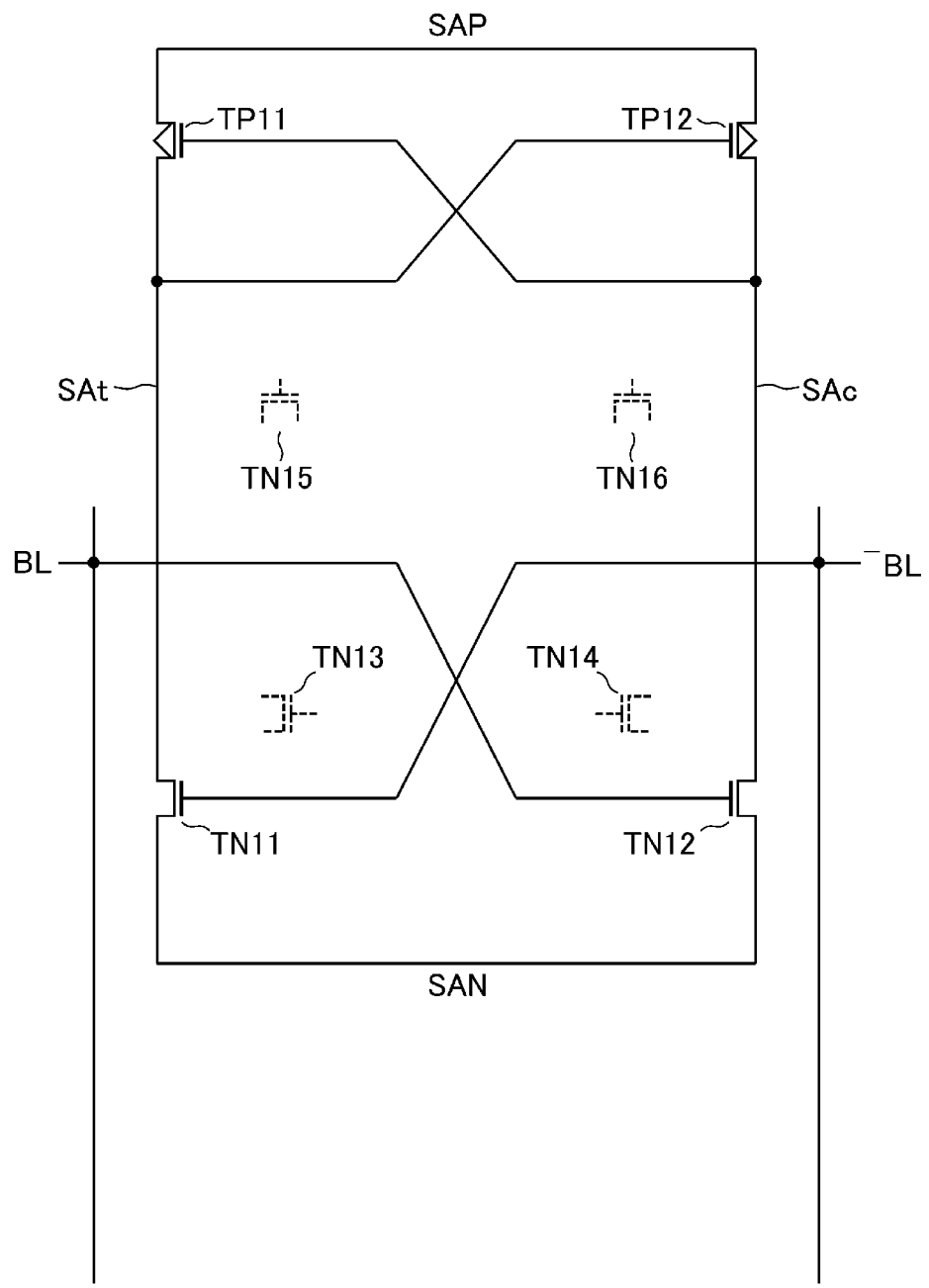
F I G. 10

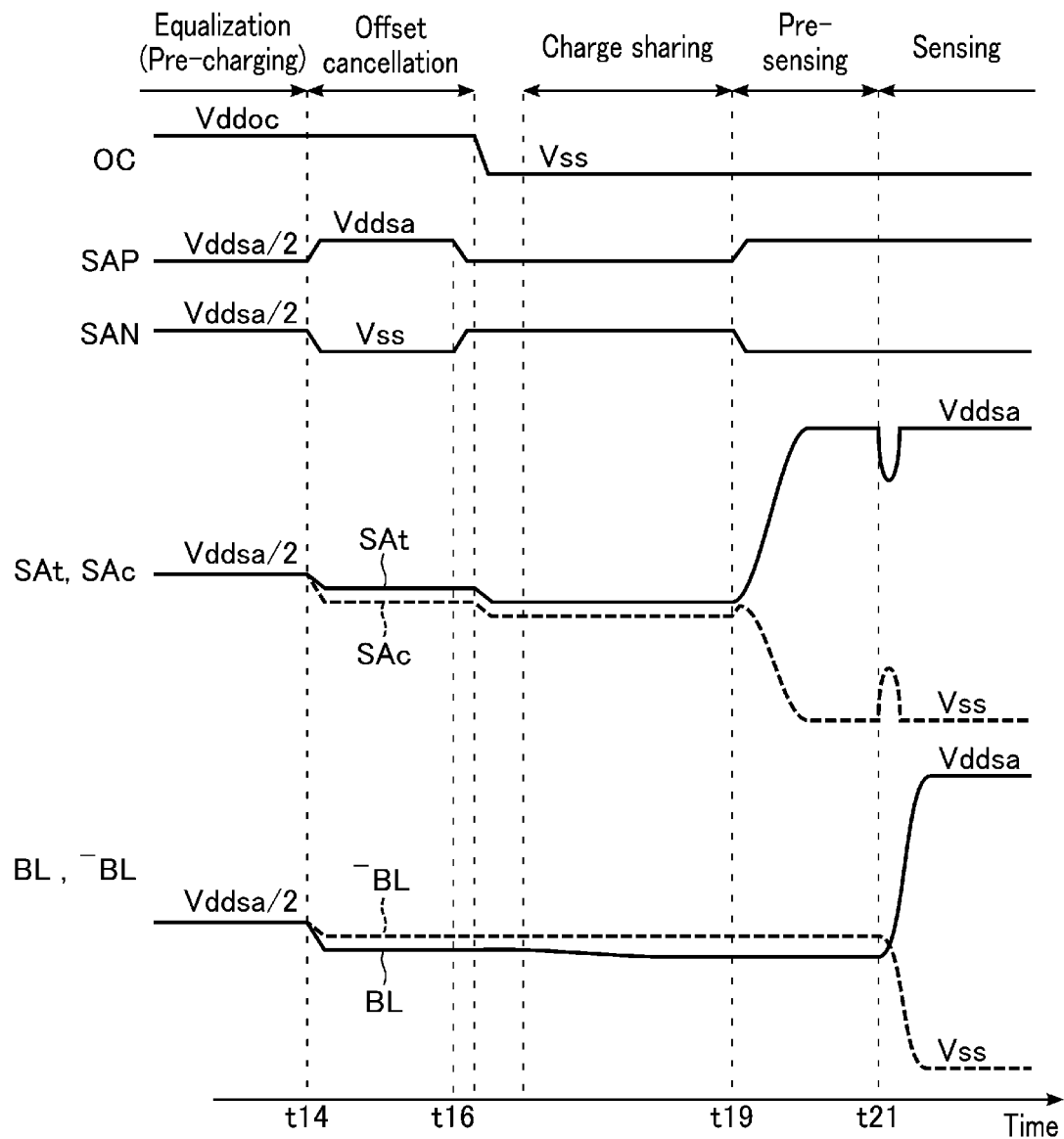
F I G. 12

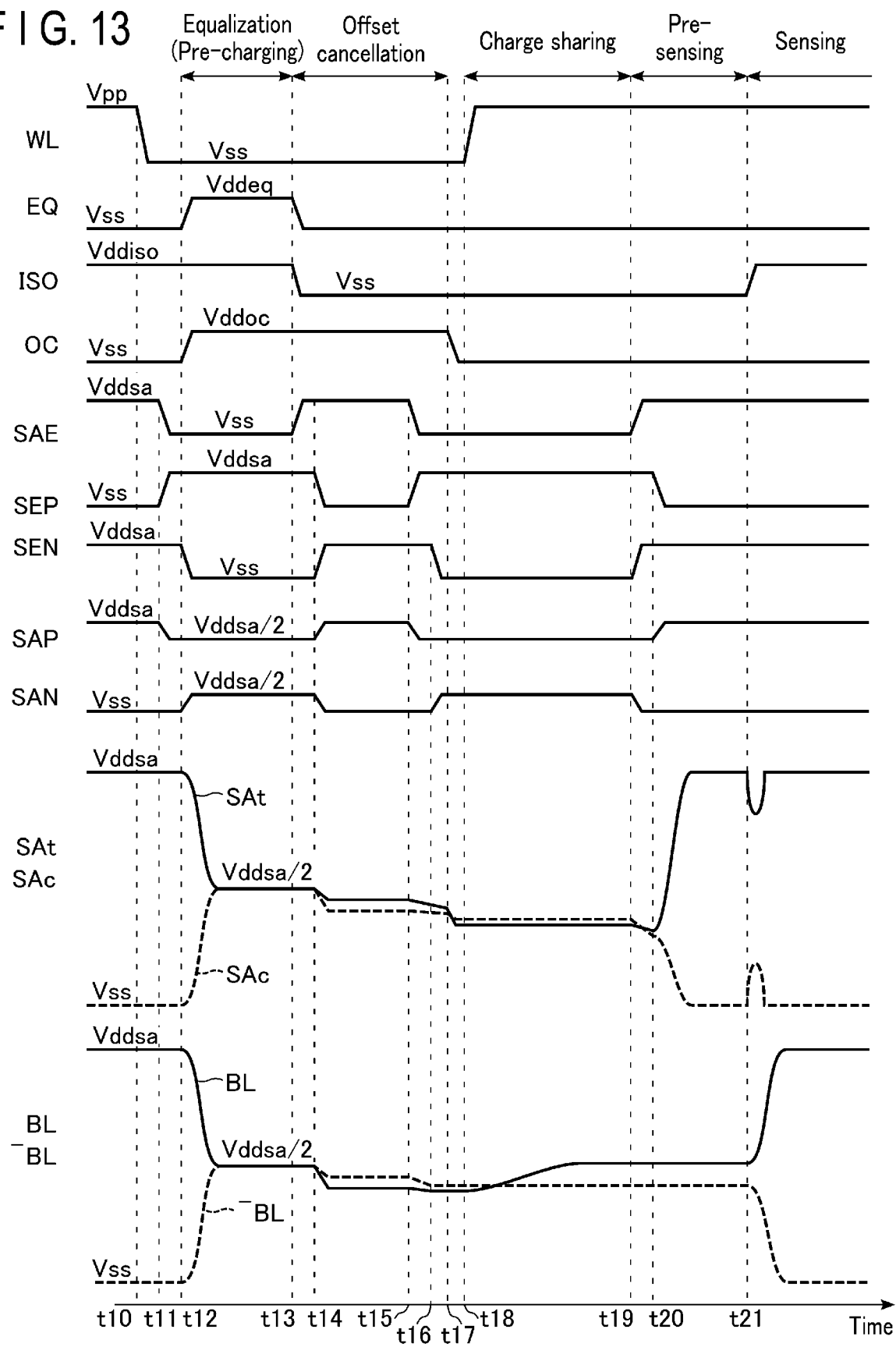

MEMORY DEVICE

CROSS-REFERENCE TO RELATED APPLICATIONS

This application is based upon and claims the benefit of priority from Japanese Patent Application No. 2022-203384, filed Dec. 20, 2022, the entire contents of which are incorporated herein by reference.

FIELD

Embodiments described herein relate generally to memory devices.

BACKGROUND

As a memory device, a dynamic random access memory (DRAM) is known. A memory cell of the DRAM includes a capacitor and a transistor. The memory cell stores data, based on the charge stored in the capacitor. The potential based on the data stored in a memory cell of a data read target is amplified by a sense amplifier, and the stored data is determined thereby.

BRIEF DESCRIPTION OF DRAWINGS

FIG. 1 shows functional blocks of a memory device according to a first embodiment and components relevant thereto.

FIG. 3 shows components of part of a sense amplifier according to the first embodiment and coupling of the components.

FIG. 8 schematically shows coupling of components of a sense amplifier circuit of the memory device during equalization according to the first embodiment.

FIG. 10 schematically shows coupling of the components of the sense amplifier circuit of the memory device during charge sharing and pre-sensing according to the first embodiment.

FIG. 12 schematically shows, along a timeline, potentials of some components of the memory device for reference during data reading.

FIG. 13 schematically shows, along a timeline, potentials of some components of the memory device during data reading according to the first embodiment.

DETAILED DESCRIPTION

Figure 2:
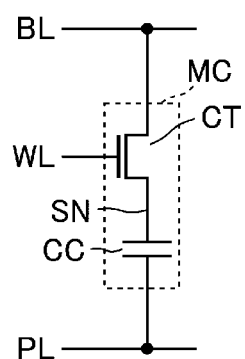
FIG. 2 shows components of a memory cell according to the first embodiment and coupling of the components.

In general, according to one embodiment, a memory device includes a capacitor, a first transistor, a first inverter circuit, a second inverter circuit, a sixth transistor, a seventh transistor, an eighth transistor, and a ninth transistor.

The first transistor has a first end coupled to the capacitor. The first inverter circuit is coupled between a first node and a second node and includes a p-type second transistor and an n-type third transistor coupled in series at a third node. The second inverter circuit is coupled between the first node and the second node and includes a p-type fourth transistor and an n-type fifth transistor coupled in series at a fourth node. The fifth transistor has a gate coupled to a second end of the first transistor. The sixth transistor is coupled between the gate of the fifth transistor and the third node. The seventh transistor is coupled between a gate of the third transistor and the fourth node. The eighth transistor is coupled between the gate of the third transistor and the third node. The ninth transistor is coupled between the gate of the fifth transistor and the fourth node. A state in which a first voltage is applied to the first node and a second voltage lower than the first voltage is applied to the second node is formed at a first time. A third voltage between the second voltage and the first voltage is applied to the first node at a second time after the first time. A fourth voltage between the second voltage and the first voltage is applied to the second node at a third time after the second time. The second voltage is applied to the second node at a fourth time after the third time. The first voltage is applied to the first node at a fifth time after the fourth time.

Embodiments will now be described with reference to the figures. In order to distinguish components having substantially the same function and configuration in an embodiment or over different embodiments from each other, an additional numeral or letter may be added to the end of each reference numeral or letter.

The specification and the claims, when mentioning that a particular (first) component is "coupled" to another (second) component, intend to cover both the form of the first component directly coupled to the second component and the form of the first component coupled to the second component via one or more components which are always or selectively conductive.

1. First Embodiment 1.1. Structure (Configuration)

FIG. 1 shows a functional block of a memory device according to a first embodiment. The memory device 1 is a device that stores data. The memory device 1 includes a memory cell array 11, an input/output circuit 12, a control circuit 13, a voltage generation circuit 14, a row selection circuit 15, a column selection circuit 16, a write circuit 17, a read circuit 18, and a sense amplifier 19.

The memory cell array 11 includes a plurality of memory cells MC, a plurality of word lines WL, and a plurality of bit lines BL. Each memory cell MC is capable of storing 1-bit data. Each memory cell MC is coupled to a single bit line BL and a single word line WL. The memory cell MC is coupled between the bit line BL and the plate line (not illustrated). The word line WL is associated with a row. The bit line BL is associated with a column. Through selection of a single row and a single column, a single memory cell MC is designated.

The input/output circuit 12 is a circuit that inputs and outputs data and signals. The input/output circuit 12 receives, from outside the memory device 1, e.g., from a memory controller, a control signal CNT, a command CMD, an address signal ADD, and data DAT. The input/output circuit 12 outputs data DAT. The data DAT is data to be written in the case of data writing in the memory device 1. The data DAT is read data in the case of data reading from the memory device 1.

The control circuit 13 is a circuit that controls the operation of the memory device 1. The control circuit 13 receives a command CMD and a control signal CNT from the input/output circuit 12. The control circuit 13 controls the write circuit 17 and the read circuit 18 based on control instructed by the command CMD and the control signal CNT.

The voltage generation circuit 14 is a circuit that generates various voltages used in the memory device 1. The voltage generation circuit 14 generates multiple voltages with different magnitudes under the control of the control circuit 13. The voltage generation circuit 14 supplies the generated voltages to the memory cell array 11, the write circuit 17, the read circuit 18, and the sense amplifier 19.

The row selection circuit 15 is a circuit that selects a row of a memory cell MC. The row selection circuit 15 receives an address signal ADD from the input/output circuit 12. The row selection circuit 15 makes a single word line WL associated with a row designated by the received address signal ADD a selected state, using a voltage received from the voltage generation circuit 14.

The column selection circuit 16 is a circuit that selects a column of a memory cell MC. The column selection circuit 16 receives an address signal ADD from the input/output circuit 12. The column selection circuit 16 makes a bit line BL associated with a column designated by the received address signal ADD a selected state, using a voltage received from the voltage generation circuit 14.

The write circuit 17 is a circuit that performs processing and control for writing data into the memory cells MC. The write circuit 17 receives data to be written from the input/output circuit 12. The write circuit 17 supplies, based on the control and data of the control circuit 13, the voltage received from the voltage generation circuit 14 to the column selection circuit 16.

The read circuit 18 is a circuit that performs processing and control for reading data from the memory cells MC. The read circuit 18 supplies potentials received from the voltage generation circuit 14 to the column selection circuit 16. The read circuit supplies control signals for data reading to the sense amplifier 19.

The sense amplifier 19 is a circuit for determining data stored in the memory cell MC. The sense amplifier 19 includes a plurality of sense amplifier circuits SAC (not illustrated). The sense amplifier 19 receives multiple voltages from the voltage generation circuit 14, and operates using the received voltages. During data reading, the sense amplifier 19 amplifies a potential of a bit line BL to determine data stored in the memory cell MC of a data read target. The determined data is supplied to the input/output circuit 12.

1.1.1. Memory Cells

FIG. 2 shows components of the memory cell according to the first embodiment and coupling of the components. Hereinafter, one of a source and a drain of a transistor may be referred to as one end of the transistor, and the other of the source and the drain may be referred to as the other end of the transistor.

As shown in FIG. 2, each memory cell MC includes a cell capacitor CC and an n-type metal-oxide-semiconductor field-effect transistor (MOSFET) CT. The cell capacitor CC is coupled to, at one end, a plate line PL, and is coupled to, at another end, one end of the transistor CT. The cell capacitor CC stores data using a charge stored in a node coupled to the transistor CT. A node of the cell capacitor CC that is coupled to the transistor CT may be hereinafter referred to as a "storage node SN".

Whether or not the storage node SN stores a charge is associated with a state in which the memory cell MC stores "1" data, or a state in which "0" data is stored. Hereinafter, as an example, the state in which the storage node SN is relatively positively charged will be treated as a state in which the memory cell MC stores "1" data, and the state in which the storage node SN is not relatively positively charged will be treated as a state in which the memory cell MC stores "0" data.

The transistor CT is coupled to, at the other end, a single bit line BL, and is coupled to, at its gate, a single word line WL.

1.1.2. Sense Amplifier

FIG. 3 shows components of part of the sense amplifier 19 according to the first embodiment and coupling of the components. As described above, the sense amplifier 19 includes a plurality of sense amplifier circuits SAC. In FIG. 3, a single sense amplifier circuit SAC is shown.

As shown in FIG. 3, each sense amplifier circuit SAC is coupled to a single bit line BL and a complementary bit line ⁻BL. The complementary bit line ⁻BL functions as a node having a reference potential. The reference potential is used to determine data stored in a memory cell MC of a data read target.

The sense amplifier circuit SAC includes bias circuits BC1 and BC2, p-type MOSFETs TP11 and TP12 and n-type MOSFETS TN11, TN12, TN13, TN14, TN15, and TN16. The sense amplifier 19 further includes transistors TN21 and TN22.

The bias circuit BC1 is coupled to a node SAP and is configured to apply one of power-supply voltages Vddsa and Vddsa/2 to the node SAP at any timing by dynamically switching the voltages. The power-supply voltage Vddsa may have the same magnitude as a power-supply voltage Vdd, which is used in the memory device 1, or may have different magnitude from that of the power-supply voltage Vdd. As an example, the bias circuit BC1 includes a p-type MOSFET TP1 and an n-type MOSFET TN2. The following description is based on this example.

The transistor TP1 is coupled between a node which receives the power-supply voltage Vddsa and the node SAP. The node which receives the power-supply voltage Vddsa receives the power-supply voltage Vddsa, for example, from the voltage generation circuit 14. The transistor TP1 receives a digital signal SEP at its gate. The signal SEP is supplied, for example, from a component of the read circuit 18 other than the sense amplifier 19.

The transistor TN2 is coupled between a node which receives the power-supply voltage Vddsa/2 and the node SAP. The node which receives the power-supply voltage Vddsa/2 receives the power-supply voltage Vddsa/2, for example, from the voltage generation circuit 14. The transistor TN2 receives the digital signal SEP at its gate. A p-type MOSFET may be provided instead of the transistor TN2. In such a case, the p-type MOSFET receives a signal ⁻SEP at its gate. The signal ⁻SEP is supplied, for example, from the read circuit 18. The signal ⁻SEP has an inverted logic level of the logic level of the signal SEP.

The bias circuit BC2 is coupled to a node SAN and is configured to apply one of ground voltages (common voltages) Vss and Vddsa/2 to the node SAN at any timing by dynamically switching the voltages. The ground voltage Vss is, for example, 0 V, and the following description is based on this example. As an example, the bias circuit BC2 includes a p-type MOSFET TP3 and an n-type MOSFET TN1. The following description is based on this example.

The transistor TN1 is coupled between the node SAN and a node which receives the ground voltage Vss. The node which receives the ground voltage Vss receives the ground voltage Vss, for example, from the voltage generation circuit 14. The transistor TN1 receives a digital signal SEN at its gate. The signal SEN is supplied, for example, from a component of the read circuit 18 other than the sense amplifier 19.

The transistor TP3 is coupled between a node which receives the power-supply voltage Vddsa/2 and the node SAN. The node which receives the power-supply voltage Vddsa/2 receives the power-supply voltage Vddsa/2, for example, from the voltage generation circuit 14. The transistor TP3 receives the signal SEN at its gate. An n-type MOSFET may be provided instead of the transistor TP3. In such a case, the n-type MOSFET receives a signal ⁻SEN at its gate. The signal ⁻SEN is supplied, for example, from a component of the read circuit 18 other than the sense amplifier 19. The signal ⁻SEN has an inverted logic level of the logic level of the signal SEN.

The transistor TP11 is coupled between the node SAP and a node SAt. The transistor TP11 is coupled to, at its gate, a node SAc. The transistor TP1 has a certain level of ON resistance while it is on. The ON resistance of a transistor is a resistance of the transistor while it is on.

The transistor TN11 is coupled between the node SAt and the node SAN. The transistor TN11 is coupled to, at its gate, a single complementary bit line ⁻BL. The transistor TN11 has a certain level of ON resistance.

The transistor TP12 is coupled between the node SAP and a node SAc. The transistor TP12 is coupled to, at its gate, the node SAt. The transistor TP12 has an ON resistance of a magnitude that is substantially identical to that of the transistor TP11. Herein, characteristics of two components being "substantially the same" means permitting cases where the two components are formed in an attempt to be the same, but are not completely the same due to unavoidable reasons such as technical limitations for forming the components and/or limitations on technique for measuring.

The transistor TN12 is coupled between the node SAc and the node SAN. The transistor TN12 is coupled to, at its gate, the bit line BL. The transistor TN12 has an ON resistance of a magnitude that is substantially identical to that of the transistor TN11.

The transistor TN13 is coupled between the node SAt and a gate of the transistor TN11. The transistor TN13 receives, at its gate, a signal OC. The signal OC is supplied from, for example, the read circuit 18.

The transistor TN14 is coupled between the node SAc and a gate of the transistor TN12. The transistor TN14 receives, at its gate, the signal OC.

The transistor TN15 is coupled between the node SAt and the bit line BL. The transistor TN15 receives, at its gate, a signal ISO. The signal ISO is supplied from, for example, the read circuit 18.

The transistor TN16 is coupled between the node SAc and the complementary bit line ⁻BL. The transistor TN16 receives, at its gate, the signal ISO.

The transistor TN21 is coupled between at least one of the bit lines BL and a node NBP. The node NBP receives a pre-charge voltage Vpc from the voltage generation circuit 14. The pre-charge voltage Vpc, which is obtained by (Vddsa−Vss)/2, is Vddsa/2 based on an example in which Vss is 0 V, and also functions as a reference voltage. The transistor TN21 receives, at its gate, a signal EQ. The signal EQ is supplied from, for example, the read circuit 18.

The transistor TN22 is coupled between at least one of the complementary bit lines ⁻BL and the node NBP. The transistor TN22 receives, at its gate, the signal EQ.

The transistors TP11 and TN11 configure an inverter circuit IV1, and the transistors TP12 and TN12 configure an inverter circuit IV2. While the transistors TN15 and TN16 are on, the inverter circuit IV1 and the inverter circuit IV2 are "cross-coupled". That is, an input node and an output node of the inverter circuit IV1 are respectively coupled to an output node and an input node of the inverter circuit IV2.

1.1.3. Read Circuit

Figure 4:
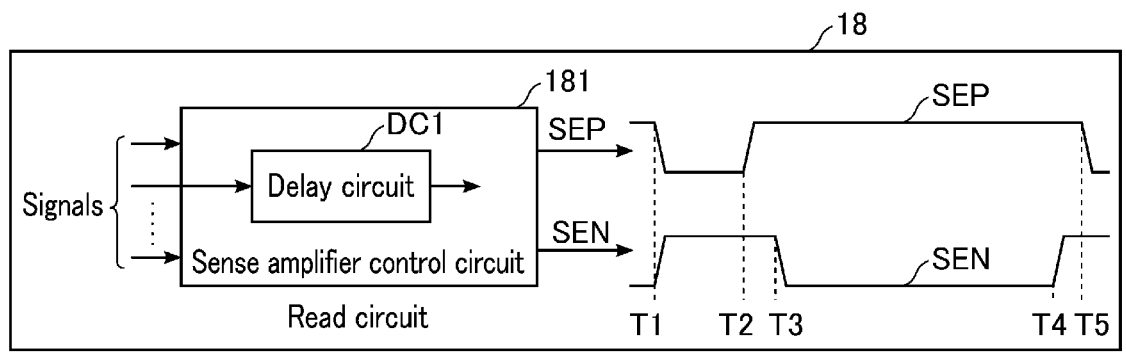
FIG. 4 shows components of a read circuit of the memory device according to the first embodiment and coupling of the components.

FIG. 4 shows the read circuit of the memory device of the first embodiment and components of the read circuit. As shown in FIG. 4, the read circuit 18 includes a sense amplifier control circuit 181. The sense amplifier control circuit 181 is a circuit which controls the sense amplifier circuit SAC, and outputs the signals for controlling the sense amplifier circuit SAC.

The sense amplifier control circuit 181 outputs the signals SEP and SEN which have logic levels changed at the timing described below. At time T1, the sense amplifier control circuit 181 changes the logic level of the signal SEP (or asserts the signal (for example, changes the signal to a L level)) and changes the logic level of the signal SEN (or asserts the signal (for example, changes the signal to a H level)). The sense amplifier control circuit 181 outputs the asserted signal SEP from time T1 to time T2 and negates the signal SEP at time T2. The sense amplifier control circuit 181 outputs the asserted signal SEN from time T1 to time T3, which is after time T2. The sense amplifier control circuit 181 outputs the signal SEN, which is negated from time T3 to time T4, and changes the logic level of the signal SEN (for example, asserts the signal) at time T4. The sense amplifier control circuit 181 outputs the signal SEP which is negated from time T2 to time T5, which is after time T4, and changes the logic level of the signal SEP (for example, asserts the signal) at time T5.

In order to output the signals SEP and SEN which have the logic levels changed at the above described timing, the sense amplifier control circuit 181 receives a plurality of control signals and includes a delay circuit DC1. The sense amplifier control circuit 181 generates the signals SEP and SEN by using the received control signals and the delay circuit DC1. The delay circuit DC1 receives at least one of the control signals received by the sense amplifier control circuit 181. The delay circuit DC1 outputs a signal which is a version of the received control signal delayed by certain determined time.

As long as the sense amplifier control circuit 181 outputs the signals SEP and SEN which change the logic levels at the above described timing, the sense amplifier control circuit 181 may have any configuration. For example, the sense amplifier control circuit 181 receives a certain first control signal and a second control signal. The second control signal is received by the delay circuit DC1, and the delay circuit DC1 outputs a third control signal, which is a version of the delayed second control signal. The sense amplifier control circuit 181 outputs the signal SEP which has the logic level which is based on the logic levels of the second control signal and the third control signal, and outputs the signal SEN which has the logic level which is based on the logic levels of the first control signal, the second control signal, and the third control signal.

For example, the sense amplifier control circuit 181 outputs the signal SEP of a second level while both of the second control signal and the third control signal are at a first level. Also, the sense amplifier control circuit 181 outputs the signal SEN of a fourth level while the first control signal is at a third level and one of the second control signal and the third control signal is at the first level. The sense amplifier control circuit 181 can include logic circuits which enable such changes in the logic levels.

Figure 5:
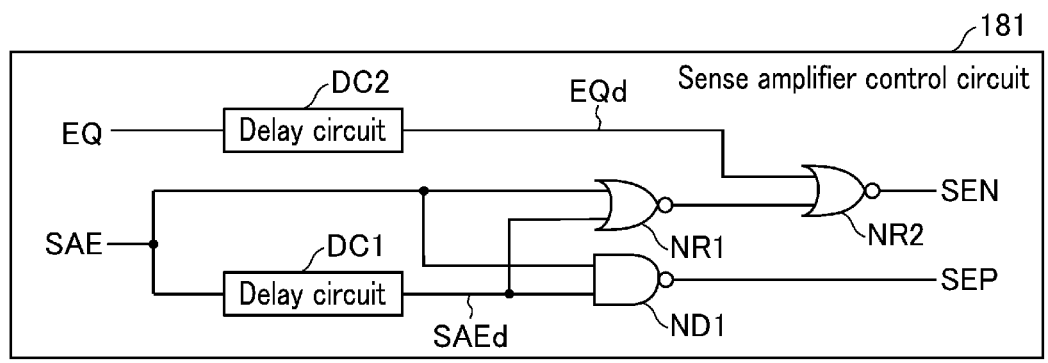
FIG. 5 shows components of a sense amplifier control circuit of the memory device according to the first embodiment and coupling of the components.

FIG. 5 shows an example of components of the sense amplifier control circuit of the memory device of the first embodiment and coupling of the components. FIG. 5 shows an example of the details of the sense amplifier control circuit 181 which outputs the signals SEP and SEN described above with reference to FIG. 4.

As shown in FIG. 5, the sense amplifier control circuit 181 includes, in addition to the delay circuit DC1, a delay circuit DC2, a negative AND (NAND) gate ND1, and negative OR (NOR) gates NR1 and NR2.

The delay circuit DC1 receives a signal SAE and outputs a signal SAEd. The signal SAE is supplied, for example, from a component in the read circuit 18 other than the sense amplifier control circuit 181. The signal SAE can function as the second control signal described above with reference to FIG. 4. The signal SAEd is a signal which is delayed from the signal SAE by a period Δt1 and follows changes in the logic level of the signal SAE after the period Δt1 elapses from the changes in the logic level of the signal SAE. The signal SAEd can function as the third control signal described above with reference to FIG. 4.

The NAND gate ND1 receives the signal SAE and the signal SAEd. The NAND gate ND1 outputs the signal SEP.

The NOR gate NR1 receives the signal SAE and the signal SAEd.

The delay circuit DC2 receives the signal EQ and outputs a signal EQd. The signal EQ is supplied, for example, from a component in the read circuit 18 other than the sense amplifier control circuit 181. The signal EQd is a signal which is delayed from the signal EQ by a period Δt2 and follows changes in the logic level of the signal EQ after the period Δt2 elapses from the changes in the logic level of the signal EQ. The period Δt2 may be the same as or different from the period Δt1. The following description is based on an example in which the period Δt1 and the period Δt2 are the same. The signal EQd can function as the first control signal described above with reference to FIG. 4.

The NOR gate NR2 receives the signal EQd and the output of the NOR gate NR1. The NOR gate NR2 outputs the signal SEN.

1.2. Operation

1.2.1. Sense Amplifier Control Circuit

Figure 6:
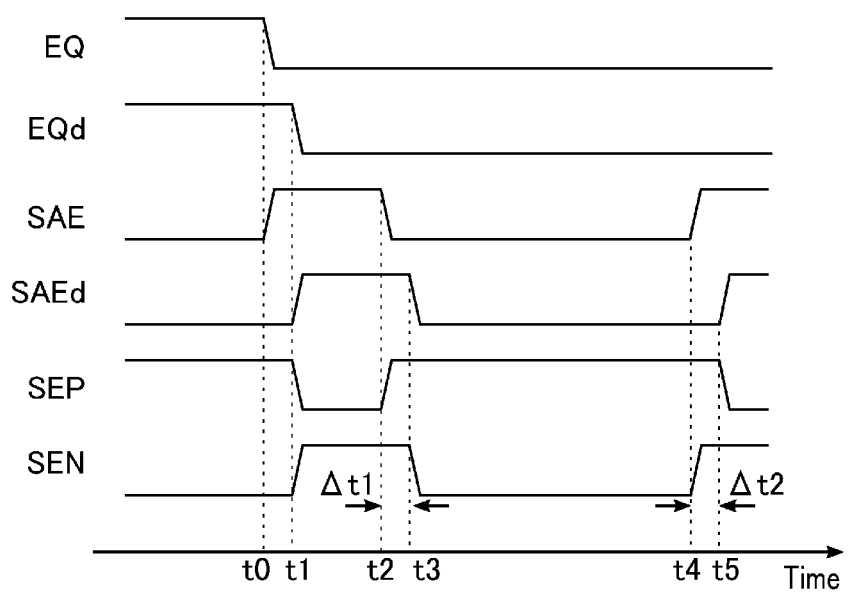
FIG. 6 shows, along a timeline, waveforms of signals in a sense amplifier control circuit of the memory device according to the first embodiment.

FIG. 6 shows, along a timeline, the waveforms of the signals in the sense amplifier control circuit of the memory device of the first embodiment. Specifically, FIG. 6 shows the waveforms of the signals in the sense amplifier control circuit 181 of the example of FIG. 5. In the following description, the level of a certain signal is maintained until time at which transition of the signal to another level is described.

At time t0, the signal EQ is negated, in other words, brought from a high level to a low level. Also, at time t0, the signal SAE is asserted, in other words, brought from the low level to the high level. Since the signal EQd is at the high level at time t0, even after the signal SAE is brought to the high level, the signal SEN is negated, in other words, has the low level.

At time t1, the signal EQd is negated, in other words, brought from the high level to the low level. Also, at time t1, the signal SAEd is asserted, in other words, brought from the low level to the high level. Based on the signals SAE and SAEd being at the high level at time t1, at time t1, the signal SEP is asserted, in other words, brought from the high level to the low level. Based on the signal SAE being at the high level and the signal EQd is at the low level at time t1, at time t1, the signal SEN is asserted, in other words, brought from the low level to the high level.

At time t2, the signal SAE is negated, in other words, brought to the low level. Based on the signal SAE being brought to the low level, at time t2, the signal SEP is negated, in other words, brought to the high level.

The period Δt1 from time t2 to subsequent time t3 depends on or matches the delay time of the delay circuit DC1.

At time t3, the signal SAEd is brought to the low level. Based on the signal SAEd is being brought to the low level, at time t3, the signal SEN is negated, in other words, brought to the low level.

At time t4, the signal SAE is brought to the high level. Since the signal EQd is at the low level at time t4, based on the signal SAE being brought to the high level, the signal SEN is brought to the high level at time t4.

The period Δt2 from time t4 to subsequent time t5 depends on or matches the delay time of the delay circuit DC1.

At time t5, the signal SAEd is brought to the high level. Based on the fact that the signal SAEd is brought to the high level, the signal SEP is brought to the low level at time t5.

1.2.2. Sense Amplifier Circuit

Figure 7:
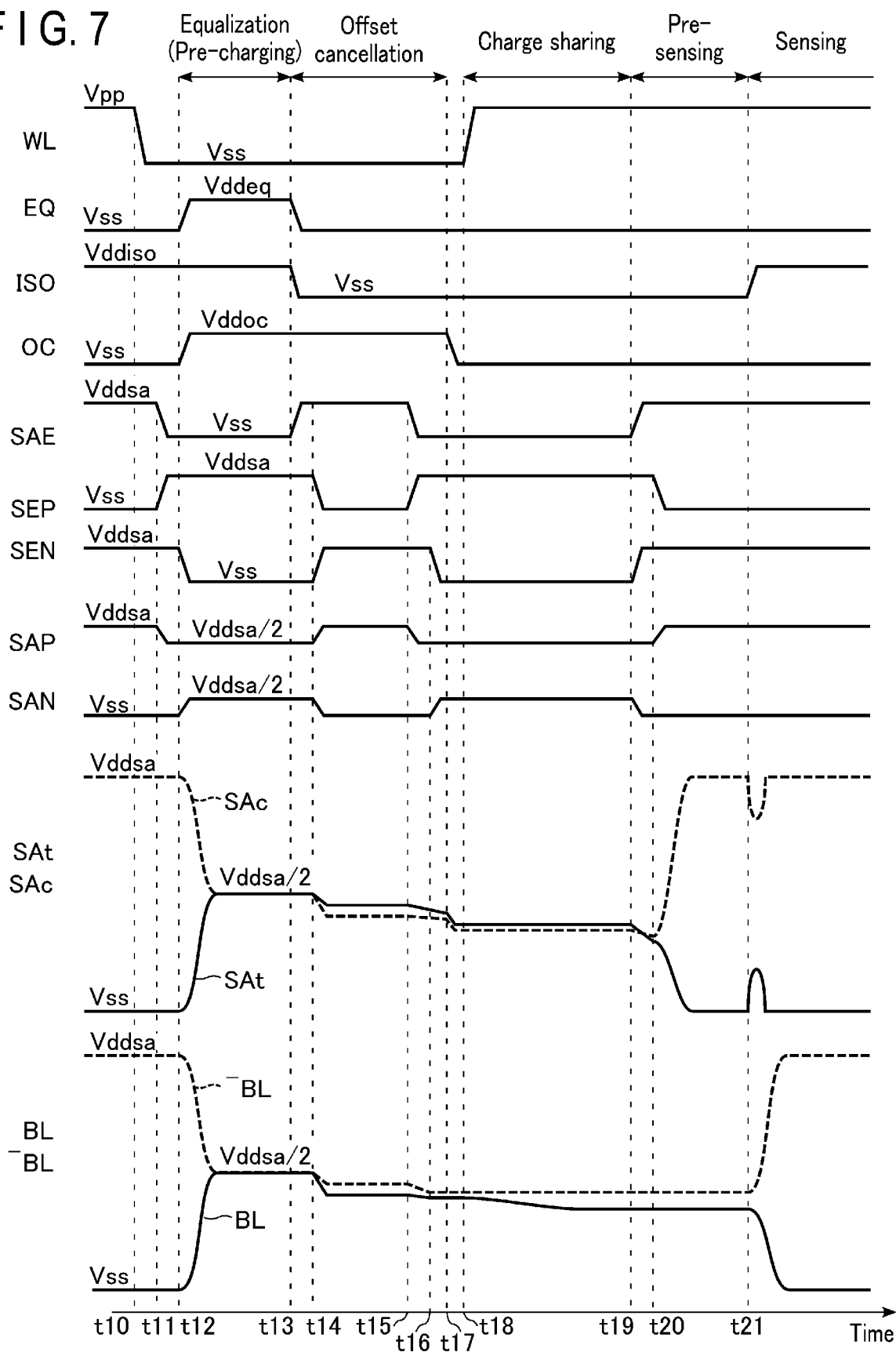
FIG. 7 schematically shows, along a timeline, potentials of some components of the memory device during data reading according to the first embodiment.

FIG. 7 shows, along a timeline, an example of potentials of some components of the memory device during data reading according to the first embodiment, showing potentials of some interconnects, nodes, and signals. Hereinafter, a memory cell MC to be a data read target may be referred to as a "selected memory cell MC". A word line WL whose potential is shown in FIG. 7 is a word line WL coupled to the selected memory cell MC, and may be hereinafter referred to as a "selected word line WL". A bit line BL whose potential is shown in FIG. 7 is a bit line BL coupled to the selected memory cell MC during data reading, and may be hereinafter referred to as a "selected bit line BL". Hereinafter, a complementary bit line ⁻BL coupled to a sense amplifier circuit SAC coupled to the selected bit line BL may be referred to as a "selected complementary bit line ⁻BL". Through application of a voltage to an illustrated interconnect or an interconnect that transmits a signal, this interconnect has substantially the same potential as the applied voltage. For example, in order for an interconnect to have a potential Vddsa, the power-supply voltage Vddsa is applied to that interconnect.

The potentials of the respective interconnects and nodes at the start of the period shown in FIG. 7 are as follows. The selected word line WL is asserted, in other words, has a power-supply potential Vpp (or, a high level). The power-supply potential Vpp is an internal power-supply potential, and has, for example, a magnitude different from that of a potential (or, power-supply potential) Vdd of the power-supply voltage Vdd. Since the selected word line WL has the power-supply potential Vpp, the transistor CT of the selected memory cell MC is on, and the cell capacitor CC of the selected memory cell MC is coupled to the selected bit line BL.

The signal EQ is negated, in other words, has a potential (or, ground potential) Vss (or, a low level) of the ground voltage Vss. Thus, the transistors TN21 and TN22 are off, and neither the selected bit line BL nor the selected complementary bit line ⁻BL is coupled to the node NBP with a pre-charge voltage Vpc.

The signal ISO is asserted, in other words, has a power-supply potential Vddiso or, a high level). The power-supply potential Vddiso is an internal power-supply potential, and has, for example, a magnitude different from that of the power-supply potential Vdd. A transistor TN15 is on with the power-supply potential Vddiso at its gate, and the selected bit line BL is coupled to the node SAt via the transistor TN15 that is on. Thus, the selected bit line BL and the node SAt have substantially the same potential. The transistor TN16 is on with the power-supply potential Vddiso at its gate, and the selected complementary bit line ⁻BL is coupled to the node SAc via the transistor TN16 that is on. Thus, the selected complementary bit line ⁻BL and the node SAc have substantially the same potential.

The signal OC is negated, in other words, has a ground potential Vss (or, a low level). The transistor TN13 is off with the ground potential Vss at its gate, and thus the gate of the transistor TN11 is decoupled from the node SAt. The transistor TN14 is off with the ground potential Vss at its gate, and thus the gate of the transistor TN12 is decoupled from the node SAc.

The signal SAE has the power-supply potential Vddsa (or, high level). Therefore, because of the mechanism described above with reference to FIG. 5 and FIG. 6, the signal SEP has the ground potential Vss, and the signal SEN has the power-supply potential Vddsa. As a result, the transistors TP1 and TN1 are on. Therefore, the node SAP has the power-supply potential Vddsa, and the node SAN has the ground potential Vss. Therefore, the sense amplifier circuit SAC is supplied with the power supply and is on, in other words, in an operable state.

Based on such states of the potentials, one of the selected bit line BL and the selected complementary bit line ⁻BL has the power-supply potential Vddsa, and the other has the ground potential Vss. Which of the selected bit line BL and the selected complementary bit line ⁻BL has the power-supply potential Vddsa depends on whether the selected memory cell MC stores "0" data or "1" data.

When the selected memory cell MC stores "0" data, the selected bit line BL has the ground potential Vss, and the storage node SN has the ground potential Vss. On the other hand, when the selected memory cell MC stores "1" data, the selected bit line BL has the power-supply potential Vddsa, and the storage node SN has the power-supply potential Vddsa. Hereinafter, the case where the selected memory cell MC stores "0" data may be referred to as "0-data storage case", and the case where the selected memory cell MC stores "1" data may be referred to as "1-data storage case". FIG. 7 shows the "0-data storage case.

At time t10, the selected word line WL is negated, in other words, the potential of the selected word line WL is brought to the ground potential Vss (or, a low level). Thus, the transistor CT of the selected memory cell MC is turned off, and the cell capacitor CC of the selected memory cell MC is decoupled from the selected bit line BL. The selected word line WL may have a negative potential instead of the ground potential Vss.

At time t10, the potential of the signal SAE is at the power-supply potential Vddsa. Therefore, because of the mechanism described above with reference to FIG. 5 and FIG. 6, the signal SEP has the ground potential Vss (or, a low level), and the signal SEN has power-supply potential Vddsa (or, high level). Therefore, the transistors TP1 and TN1 are on.

At time t11, the potential of the signal SAE is brought to the ground potential Vss (or, a low level). Based on this fact, the potential of the signal SEP is brought to the power-supply potential Vddsa; and, as a result, the transistor TP1 is turned off, and the transistor TN2 is turned on. As a result, the potential of the node SAP is brought to the potential Vddsa/2.

Time t12 to time t13 is a period of pre-charging (or equalizing). Because of the mechanism described above with reference to FIG. 5 and FIG. 6, at time t12 after the period Δt1 has elapsed from time t11 at which the potential of the signal SAE is brought to the ground potential Vss, the potential of the signal SEN is brought to the ground potential Vss (low level). As a result, the transistor TN1 is turned off, and the transistor TP3 is turned on. As a result, the potential of the node SAN is brought to the potential Vddsa/2. Since the potential of each of the node SAP and the node SAN is the potential Vddsa/2, the sense amplifier circuit SAC is not supplied with the power supply which is required for operation, and does not have the function to amplify potentials. A voltage applied to the node SAP and the node SAN is (Vddsa+Vss)/2. However, since a case is assumed where the ground voltage Vss is 0 V as described above, the voltage that is applied is the voltage Vddsa/2.

At time T12, the signal EQ is asserted, in other words, the potential of the signal EQ is brought to a power-supply potential Vddeq (or, a high level). The power-supply potential Vddeq is an internal power-supply potential, and has, for example, a magnitude different from that of the power-supply potential Vdd. With the application of the power-supply potential Vddeq, the transistors TN21 and TN22 are turned on, and the selected bit line BL and the selected complementary bit line ⁻BL are coupled to the node NBP. As a result, both the selected bit line BL and the selected complementary bit line ⁻BL are equalized to the same potential. Specifically, both the selected bit line BL and the selected complementary bit line ⁻BL are pre-charged to the potential of the pre-charge voltage Vpc, in other words, the potential Vddsa/2.

At time t12, the signal OC is asserted, in other words, the potential of the signal OC is brought to a power-supply potential Vddoc (or, a high level). The power-supply potential Vddoc is an internal power-supply potential, and has, for example, a magnitude different from that of the power-supply potential Vdd. The transistors TN13 and TN14 are on with the power-supply potential Vddoc at their gates. FIG. 8 schematically shows coupling of the components of the sense amplifier circuit SAC during equalization. In FIG. 8 and FIGS. 9, 10, and 11 subsequent thereto, some of the transistors that are on are represented by an interconnect that couples both ends of the transistors. Some of the transistors that are off are shown by dashed lines or not shown.

With the transistor TN13 that is on, the transistor TN11 is diode-coupled. With the transistor TN14 that is on, the transistor TN12 is diode-coupled.

With the node TN15 that is on, the selected bit line BL is coupled to the node SAt. With the transistor TN16 that is on, the selected complementary bit line ⁻BL is coupled to the node SAc.

As shown in FIG. 7, a period from time t13 to time t17 is an offset cancellation period. At time t13, the signal EQ is negated. Thereby, pre-charging of the selected bit line BL and the selected complementary bit line ⁻BL ends.

At time t13, the signal ISO is negated, in other words, the potential of the signal ISO is brought to the ground potential Vss. Thereby, the transistors TN15 and TN16 are turned off. Furthermore, the potential of the signal SAE is brought to the power supply potential Vddsa at time t13.

Figure 9:
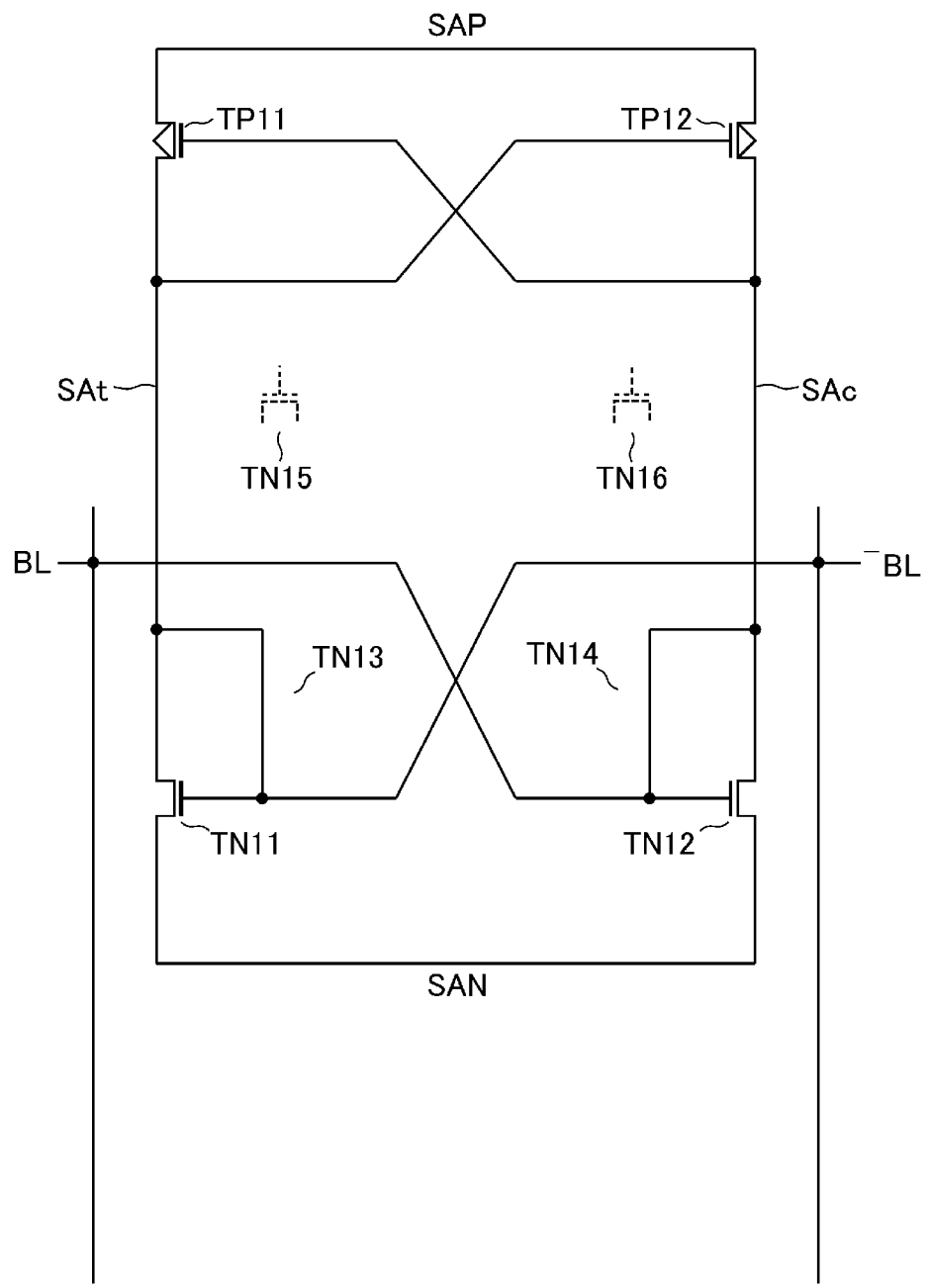
FIG. 9 schematically shows coupling of the components of the sense amplifier circuit of the memory device during offset cancellation according to the first embodiment.

FIG. 9 schematically shows coupling of the components of the sense amplifier circuit SAC during offset cancellation. With the transistor TN15 that is off, the selected bit line BL is decoupled from the node SAt, in other words, isolated therefrom. With the transistor TN16 that is off, the selected complementary bit line ⁻BL is decoupled from the node SAc, in other words, isolated therefrom. Thus, the inverter circuit IV1 (i.e., the set of the transistors TP11 and TN11) and the inverter circuit IV2 (i.e., the set of the transistors TP12 and TN12) are not cross-coupled.

On the other hand, the node SAt is coupled to the selected complementary bit line ⁻BL via the transistor TN13 that is on, as described above. Thus, the potential of the node SAt is transferred to the selected complementary bit line ⁻BL, and the node SAt has a potential substantially the same as that of the complementary bit line ⁻BL. With the transistor TN14 that is on, the node SAc is coupled to the selected bit line BL. Thus, the potential of the node SAc is transferred to the selected bit line BL, and the node SAc has a potential substantially the same as that of the selected bit line BL.

As shown in FIG. 7, because of the mechanism described above with reference to FIG. 5 and FIG. 6, at time t14 after the period Δt2 has elapsed from time t13 at which the potential of the signal SAE is brought to the power-supply potential Vddsa, the potential of the signal SEP is brought to the ground potential Vss, and the potential of the signal SEN is brought to the power-supply potential Vddsa. As a result, the potential of the node SAP is brought to the power-supply potential Vddsa, and the potential of the node SAN is brought to the ground potential Vss. Therefore, the sense amplifier circuit SAC becomes an operable state.

With the end of pre-charging and the start of isolation at time t13 and the start of the operation of the sense amplifier circuit SAC at time t14, the potentials of the selected bit line BL and the selected complementary bit line ⁻BL change from the pre-charge potential (Vddsa/2) from time t14. At this change, offset cancellation occurs through the action of the transistors TN13 and TN14. That is, the transistor TN11 is on by the transistor TN13, and thereby the ON resistance of the transistor TN11 is formed between the node SAt and the node SAN. Thus, a potential based on a ratio of the ON resistance of the transistor TP11 and the ON resistance of the transistor TN11 is generated at the node SAt. In general, a p-type MOSFET and an n-type MOSFET have different ON resistances, with the ON resistance of the n-type MOSFET being smaller than the ON resistance of the p-type MOSFET. Thus, the potential of the node SAt is not a median of a difference between the potential of the node SAP and the potential of the node SAN, but a potential lower than the median.

Also, the transistor TN12 is on by the transistor TN14, and thereby the ON resistance of the transistor TN12 is formed between the node SAc and the node SAN. Thus, a potential based on a ratio of the ON resistance of the transistor TP12 and the ON resistance of the transistor TN12 is generated at the node SAc. Thus, for a reason similar to that described above with reference to the node SAt, the potential of the node SAc is not a median of a difference between the potential of the node SAP and the potential of the node SAN, but a potential lower than the median. FIG. 7 shows an example where the node SAc is lower than the node SAt in potential. The following description is based on such an example.

With the change in potential of the node SAt caused by the offset cancellation, the potential of the selected complementary bit line ⁻BL coupled to the node SAt via the transistor TN13 also changes. That is, the potential of the node SAt is reflected to the potential of the selected complementary bit line ⁻BL. With the change in potential of the node SAc caused by the offset cancellation, the potential of the selected bit line BL coupled to the node SAc via the transistor TN14 also changes. That is, the potential of the node SAc is reflected to the potential of the selected bit line BL. One of the potentials of the selected bit line BL and the selected complementary bit line ⁻BL drops from the potential Vddsa/2 by a positive magnitude ΔV1, and the other potential drops from the potential Vddsa/2 by a positive magnitude ΔV2. The difference between ΔV1 and ΔV2 is generated by a difference (or, offset) in ON resistance between the transistor TP11 and the transistor TP12 and a difference in ON resistance between the transistor TN11 and the transistor TN12, and based on these differences.

At time t15, the potential of the signal SAE is brought to the ground potential Vss. Therefore, the potential of the signal SEP is brought to the power-supply potential Vddsa, and, as a result, the potential of the node SAP is brought to the potential Vddsa/2. As a result, the potentials of the nodes SAt and SAc drop. Furthermore, the potentials of the selected complementary bit line ⁻Bl and the selected bit line BL follow the potentials of the nodes SAt and SAc, respectively, and also drops.

Because of the mechanism described above with reference to FIG. 5 and FIG. 6, at time t16 after the period Δt1 has elapsed from time t15 at which the potential of the signal SAE is brought to the ground potential Vss, the potential of the signal SEN is brought to the ground potential Vss. Therefore, drop in the potentials of the nodes SAt and SAc stops. In addition, drop in the potentials of the selected complementary bit line ⁻BL and the selected bit line BL also stops. The node SAt after the drop in the potential stops has a potential based on the ON resistance of the transistor TN11.

At time t17, the signal OC is negated, in other words, the potential of the signal OC is brought to the ground potential Vss. As a result, the transistors TN13 and TN14 are turned off. Therefore, the offset cancellation is terminated. Also, since the transistors TN13 and TN14 are turned off, the nodes SAt and SAc are decoupled from the selected complementary bit line ⁻BL and the selected bit line BL, respectively. Therefore, the potential of the node SAt and the potential of the selected complementary bit line ⁻BL become independent from each other, and the potential of the node SAc and the potential of the selected bit line BL become independent from each other.

The transistor TN13 has parasitic capacitance between its gate and drain. When the potential of the gate of the transistor TN13 drops due to the potential of the signal OC brought to the ground potential Vss at time t17 because of the capacitance, the potential of the drain, and in turn the potential of the node SAt drops. On the other hand, since the selected complementary bit line ⁻BL coupled to the node SAt has larger parasitic capacitance than the node SAt, the potential thereof hardly drops.

Similarly, the transistor TN14 has parasitic capacitance between its gate and drain. When the potential of the gate of the transistor TN14 drops due to the potential of the signal OC brought to the ground potential Vss at time t17 because of the capacitance, the potential of the drain, and in turn the potential of the node SAc drops. On the other hand, since the selected bit line BL coupled to the node SAc has larger parasitic capacitance than the node SAc, the potential thereof hardly drops.

When the offset cancellation is terminated, the node SAc has a potential based on the ON resistance of the transistor TN12, and the node SAt has a potential based on the ON resistance of the transistor TN11. The difference between the potential of the node SAt and the potential of the node SAc is based on the difference between the ON resistance of the transistor TN11 and the ON resistance of the transistor TN12. With the nodes SAt and SAc which have such potentials, the selected complementary bit line ⁻BL and the selected bit line BL are already charged respectively when the offset cancellation is terminated. Based on the potentials of the selected bit line BL and the selected complementary bit line ⁻BL charged with such potentials, sensing is carried out later. The difference between the potential of the node SAt and the potential of the node SAc based on the difference between the ON resistances of the transistors TN11 and TN12 leads to a deviation between the potential of the selected bit line BL and the potential of the selected complementary bit line ⁻BL. On the other hand, before the sensing, the selected complementary bit line ⁻BL and the selected bit line BL are charged with the potentials based on the difference between the ON resistances of the transistors TN11 and TN12 via the node SAt and the node SAc by the offset cancellation. Therefore, in the sensing, the difference between the ON resistances of the transistors TN11 and TN12 can be equivalently cancelled (or, compensated for).

As shown in FIG. 7, time t18 to time t19 is a period of charge sharing. At time t18, the selected word line WL is asserted. This initiates the charge sharing. The charge sharing allows a charge stored in the selected bit line BL and a charge stored in the storage node SN of the selected memory cell MC to be shared. As a result, the potential of the selected bit line BL rises or drops based on the data stored in the selected memory cell MC. The potential of the selected bit line BL (and the storage node SN) enters a state of having a magnitude of when the potential of the selected bit line BL and the potential of the storage node SN become equal.

In the 0-data storage case, the potential of the selected bit line BL drops toward the potential of the storage node SN, and the potential of the storage node SN rises toward the potential of the selected bit line BL. The selected bit line BL and the storage node SN enter a state of having a potential of a magnitude of when the dropping potential of the selected bit line BL and the rising potential of the storage node SN become equal. The potential of the selected complementary bit line ⁻BL is maintained.

On the other hand, in the 1-data storage case (not shown), the potential of the storage node SN drops toward the potential of the selected bit line BL, and the potential of the selected bit line BL rises toward the potential of the storage node SN. The selected bit line BL and the storage node SN enter a state of having a potential of a magnitude of when the rising potential of the selected bit line BL and the dropping potential of the storage node SN become equal. The potential of the selected complementary bit line ⁻BL is maintained.

FIG. 10 schematically shows coupling of the components of the sense amplifier circuit SAC during the charge sharing and subsequent pre-sensing. Since the transistors TN13 and TN15 are off, the node SAt is decoupled from both of the selected bit line BL and the selected complementary bit line ⁻BL. Since the transistors TN14 and TN16 are off, the node SAc is decoupled from both of the selected complementary bit line ⁻BL and the selected bit line BL.

As shown in FIG. 7, time t19 to time t21 is the period of pre-sensing. At time t19, the potential of the signal SAE is brought to the power-supply potential Vddsa. Therefore, because of the mechanism described above with reference to FIG. 5 and FIG. 6, the potential of the signal SEN is brought to the power-supply potential Vddsa, and the potential of the node SAN is brought to the ground potential Vss. As a result, the sense amplifier circuit SAC starts operating. However, the sense amplifier circuit SAC is not supplied with the power-supply potential Vddsa at the node SAP and therefore carries out limited operation to lower the potentials of the nodes SAt and SAc to the ground potential Vss. Therefore, the potential of the node SAt and the potential of the node SAc approaches the ground potential Vss. Since the potential of the selected complementary bit line ⁻BL is higher than the potential of the selected bit line BL, the transistor TN11 is turned on stronger than the transistor TN12. Therefore, the potential of the node SAt drops more than the potential of the node SAc.

At time t20 after the period Δt2 has elapsed from time t19 at which the potential of the signal SAE is brought to the power-supply potential Vddsa, the potential of the signal SEP is brought to the ground potential Vss, and the potential of the node SAP is brought to the power-supply potential Vddsa. Therefore, the sense amplifier circuit SAC enters a state in which the sense amplifier circuit SAC can raise the potential of one of the nodes SAt and SAc to the power-supply potential Vddsa and lower the potential of the other one to the ground potential Vss. As a result, the potential of the node SAc is raised to the power-supply potential Vddsa, and the potential of the node SAt is lowered to the ground potential Vss.

At and after time t21 is a period of sensing (or main sensing). At time t21, the signal ISO is asserted, and, as a result, the transistors TN15 and TN16 are turned on. Therefore, the node SAt is coupled to the selected bit line BL via the transistor TN15, and the node SAc is coupled to the selected complementary bit line ⁻BL via the transistor TN16. Therefore, because of amplification by the sense amplifier circuit SAC, the potential of the selected bit line BL is lowered to the ground potential Vss, and the potential of the selected complementary bit line ⁻BL is raised to the power-supply potential Vddsa.

Figure 11:
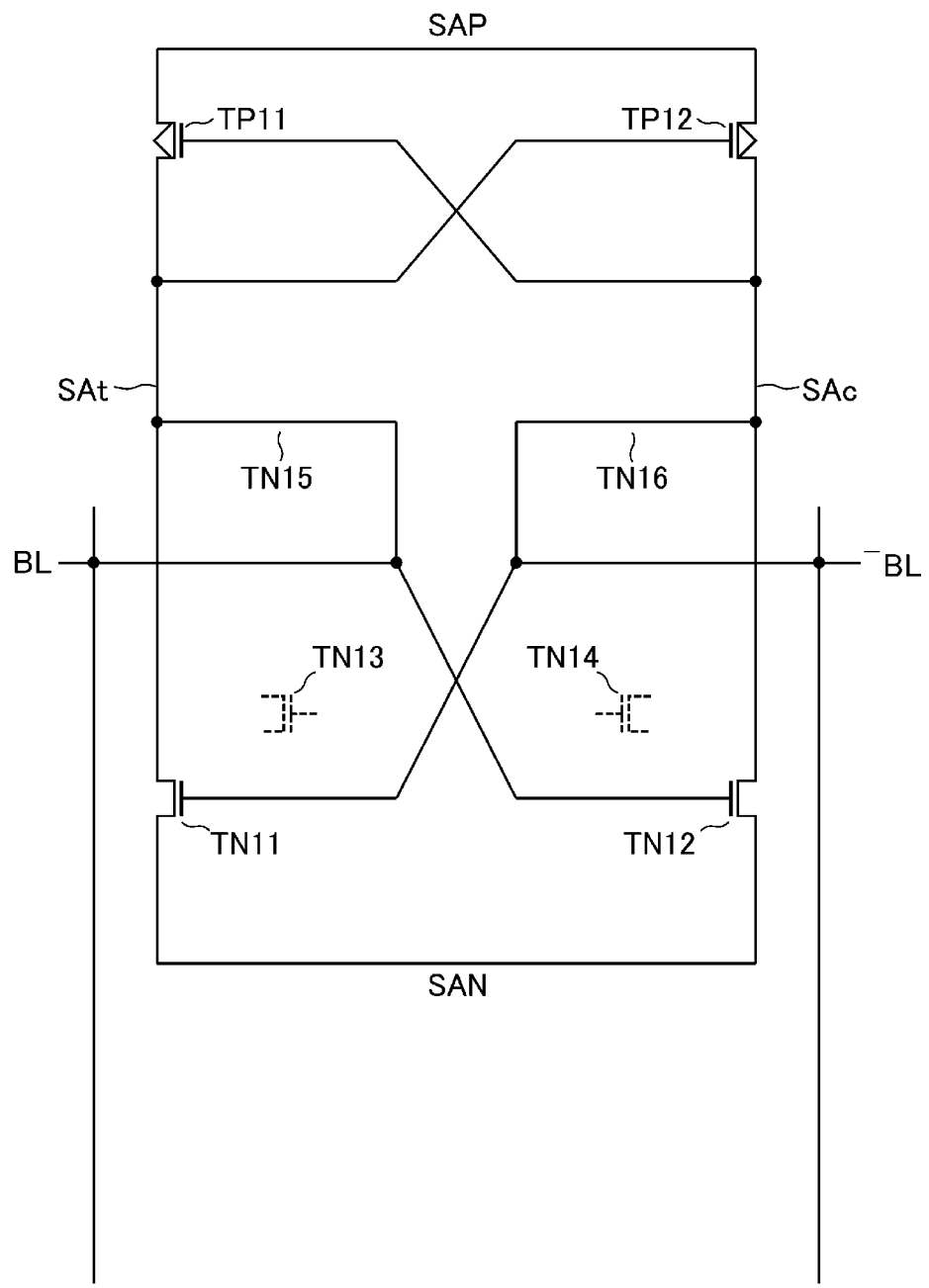
FIG. 11 schematically shows coupling of the components of the sense amplifier circuit of the memory device during sensing according to the first embodiment.

FIG. 11 schematically shows coupling of the components of the sense amplifier circuit SAC during the sensing. Since the transistor TN13 is off, the node SAt is decoupled from the selected complementary bit line ⁻BL. Since the transistor TN14 is off, the node SAc is decoupled from the selected bit line BL. On the other hand, since the transistor TN15 is on, the node SAt is coupled to the selected bit line BL. Since the transistor TN16 is turned on, the node SAc is coupled to the selected complementary bit line ⁻BL.

1.3. Advantages (Advantageous Effects)

According to the first embodiment, as described below, a memory device capable of determining data, which is stored in memory cells, with high reliability can be provided.

For comparison, a memory device for reference will be described. A memory device 100 (not shown) for reference does not have the sense amplifier control circuit 181. Instead, when offset cancellation is terminated, the memory device 100 changes potentials of nodes SAP and SAN to a potential Vddsa/2 at the same timing. Also, when pre-sensing starts, the memory device 100 changes the potentials of the nodes SAP and SAN to a power-supply potential Vddsa and a ground potential Vss, respectively, at the same timing.

FIG. 12 schematically shows, along a timeline, the potentials of some components of the memory device for reference during data reading and shows the potentials of some of interconnects, nodes, and signals. Among the periods of the first embodiment shown in FIG. 7, FIG. 12 shows the periods except for the initial part. FIG. 12 only shows a signal OC, nodes SAP, SAN, SAc, and SAt, a selected bit line BL, and a selected complementary bit line ⁻BL. The potential of a selected word line WL and signals EQ and ISO have the same waveforms as the waveforms shown in FIG. 7.

In order to start pre-sensing, at time t19, the nodes SAP and SAN are brought to the power-supply potential Vddsa and the ground potential Vss, respectively. Therefore, the sense amplifier circuit SAC enters a state in which the sense amplifier circuit SAC can raise the potentials of the nodes SAt and SAc to the power-supply potential Vddsa or lower the potentials to the ground potential Vss. Therefore, the node SAt receives the force to raise the potential of the node SAt to the power-supply potential Vddsa via a transistor TP11 and the force to lower the potential of the node SAt to the ground potential Vss via a transistor TN11. The potential of the node SAt depends on the capability (driving force) of conducting drain currents of the transistors TP11 and TN11 and the potentials of the node SAc and the selected complementary bit line ⁻BL, which drive these transistors. Similarly, the node SAc receives the force to raise the potential of the node SAc to the power-supply potential Vddsa via the transistor TP12 and the force to lower the potential of the node SAc to the ground potential Vss via the transistor TN12. The potential of the node SAc depends on the driving force of the transistors TP12 and TN12 and the potentials of the node SAt and the selected bit line BL, which drive these transistors.

In order to correctly determine stored "0" data, the pre-sensing has to bring the potential of the node SAt to the ground potential Vss and bring the potential of the node SAc to the power-supply potential Vddsa. However, as shown in FIG. 7, depending on the driving force of the transistors TP11, TP12, TN11, and TN12, the potentials of the nodes SAc and SAt, and the potentials of the selected bit line BL and the selected complementary bit line ⁻BL, the pre-sensing may unintentionally cause the node SAt to have the power-supply potential Vddsa and cause the node SAc to have the ground potential Vss. This happens in the case in which the force that raises the potential of the node SAt via the transistor TP11 exceeds the force that lowers the potential of the node SAt via the transistor TN11 and/or the case in which the force that lowers the potential of the node SAc via the transistor TN12 exceeds the force that raises the potential of the node SAc via the transistor TP12. This phenomenon is more readily caused by drop in the potentials of the nodes SAt and SAc caused by the transition of the signal OC to a low level at time t17 as in the first embodiment.

If sensing starts at time t21 in the state that the nodes SAt and SAc have the power-supply potential Vddsa and the ground potential Vss, respectively, the selected bit line BL is brought to the power-supply potential Vddsa, and the selected complementary bit line ⁻BL is brought to the ground potential Vss. This is the state that is formed when a selected memory cell MC stores "1" data. Thus, the data stored in the selected memory cell MC is erroneously determined.

The memory device 1 of the first embodiment applies the ground voltage Vss only to the node SAN among the nodes SAP and SAN immediately after start of the pre-sensing and, then, applies the power-supply voltage Vddsa and the ground voltage Vss to the nodes SAP and SAN, respectively. Therefore, while only the ground voltage Vss is applied to the node SAN, the sense amplifier circuit SAC does not have the capability to raise the potentials of the nodes SAt and SAc to the power-supply potential Vddsa. Therefore, immediately after the pre-sensing starts, even if the transistors TP11 and TP12 turn on, the sense amplifier circuit SAC only receives the force which raises the potentials of the nodes SAt and SAc to the potential Vddsa/2. Therefore, the force that raises the potential of the node SAt via the transistor TP11 is suppressed from exceeding the force that lowers the potential of SAt via the transistor TN11. More specifically, the potential of the node SAt brought to the power-supply potential Vddsa and the potential of the node SAc brought to the ground potential Vss as a result of the pre-sensing is suppressed, and in turn erroneous reading of data is suppressed.

Also, the memory device 1 of the first embodiment stops applying the power-supply voltage Vddsa to the node SAP before the offset cancellation is terminated. In the case in which the node SAP receives the power-supply voltage Vddsa and the node SAN receives the ground voltage Vss during the offset cancellation, the nodes SAt and SAc after the offset cancellation have the potentials which reflect variations in the threshold voltages of the transistors TP11, TP12, TN11, and TN12 based on the state that the node SAP receives the power-supply voltage Vddsa and the node SAN receives the ground voltage Vss. However, in the first embodiment, immediately after the pre-sensing starts, the node SAP receives the voltage Vddsa/2, and the node SAN receives the ground voltage Vss. Based on this, immediately before the offset cancellation is terminated, application of the ground voltage Vss to the node SAN is stopped. By doing this, the nodes SAt and SAc after the offset cancellation have the potentials which reflect the variations in the threshold voltages of the transistors TP11, TP12, TN11, and TN12 based on the state that the voltage Vddsa/2 is applied to the node SAP and the ground voltage Vss is applied to the node SAN. Therefore, the conditions that the potentials of the nodes SAt and SAc are determined by the offset cancellation and the conditions immediately after the pre-sensing starts that triggers compensation by the offset cancellation match. Therefore, the compensation by the offset cancellation can be correctly carried out.

The description hereinabove is based on the 0-data storage case. The same advantage can be obtained also in the 1-data storage case. FIG. 13 schematically shows, along a timeline, another example of the potentials of some components of the memory device of the first embodiment during data reading and shows the potentials of some of interconnects, nodes, and signals. FIG. 13 shows the 1-data storage case. Also, FIG. 13 shows an example in which the node SAc has a lower potential than the potential of the node SAt as a result of the offset cancellation. In the 1-data storage case, the potential of the selected bit line BL rises from time t18 because of charge sharing.

In the case shown in FIG. 13, in order to correctly determine the stored "1" data, the pre-sensing has to bring the node SAt to the power-supply potential Vddsa and bring the node SAc to the ground potential Vss. However, depending on the driving force of the transistors TP11, TP12, TN11, and TN12, the potentials of the nodes SAc and SAt, and the potentials of the selected bit line BL and the selected complementary bit line ⁻BL, the pre-sensing may unintentionally cause the node SAt to have the ground potential Vss and cause the node SAc to have the power-supply potential Vddsa.

Immediately after the pre-sensing starts, only the node SAN among the nodes SAP and SAN receives the ground voltage Vss, and, then, the nodes SAP and SAN receive the power-supply voltage Vddsa and the ground voltage Vss, respectively. Therefore, the force that rises the potential of the node SAc via the transistor TP12 is prevented from exceeding the force that lowers the potential of SAc via the transistor TN12. More specifically, the potential of the node SAt brought to the ground potential Vss and the potential of the node SAc brought to the power-supply potential Vddsa as a result of the pre-sensing is suppressed, and in turn erroneous reading of data is suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
a capacitor;
a first transistor that has a first end coupled to the capacitor;
a first inverter circuit that is coupled between a first node and a second node and includes a p-type second transistor and an n-type third transistor coupled in series at a third node;
a second inverter circuit that is coupled between the first node and the second node and includes a p-type fourth transistor and an n-type fifth transistor coupled in series at a fourth node, the fifth transistor having a gate coupled to a second end of the first transistor;
a sixth transistor coupled between the gate of the fifth transistor and the third node;
a seventh transistor coupled between a gate of the third transistor and the fourth node;
an eighth transistor coupled between the gate of the third transistor and the third node; and
a ninth transistor coupled between the gate of the fifth transistor and the fourth node, wherein
a state in which a first voltage is applied to the first node and a second voltage lower than the first voltage is applied to the second node is formed at a first time, a third voltage between the second voltage and the first voltage is applied to the first node at a second time after the first time, a fourth voltage between the second voltage and the first voltage is applied to the second node at a third time after the second time, the second voltage is applied to the second node at a fourth time after the third time, and the first voltage is applied to the first node at a fifth time after the fourth time.

2. The memory device according to claim 1, wherein while the first voltage is applied to the first node and the second voltage is applied to the second node, a fifth voltage higher than the second voltage is kept being applied to a gate of the eighth transistor and a gate of the ninth transistor.

3. The memory device according to claim 2, wherein before a time at which a sixth voltage higher than the second voltage is applied to a gate of the first transistor and after the third time, the second voltage is applied to the gate of the eighth transistor and the gate of the ninth transistor.

4. The memory device according to claim 1, wherein from the fourth time to the fifth time, the second voltage is applied to a gate of the sixth transistor and a gate of the seventh transistor.

5. The memory device according to claim 4, wherein after the fifth time, the second voltage is kept being applied to the gate of the sixth transistor and the gate of the seventh transistor.

6. The memory device according to claim 5, wherein while the first voltage is applied to the first node and the second voltage is applied to the second node, a fifth voltage higher than the second voltage is kept being applied to a gate of the eighth transistor and a gate of the ninth transistor.

7. The memory device according to claim 6, wherein before a time at which a sixth voltage higher than the second voltage is applied to a gate of the first transistor and after the third time, the second voltage is applied to the gate of the eighth transistor and the gate of the ninth transistor.

8. The memory device according to claim 6, wherein from a time after the third time and before the fourth time to the fifth time, the second voltage is kept being applied to the gate of the eighth transistor and the gate of the ninth transistor.

9. A memory device comprising:
a capacitor;
a first transistor that has a first end coupled to the capacitor;
a first inverter circuit that is coupled between a first node and a second node and includes a p-type second transistor and an n-type third transistor coupled in series at a third node;
a second inverter circuit that is coupled between the first node and the second node and includes a p-type fourth transistor and an n-type fifth transistor coupled in series at a fourth node, the fifth transistor having a gate coupled to a second end of the first transistor;
a sixth transistor coupled between the gate of the fifth transistor and the third node;
a seventh transistor coupled between a gate of the third transistor and the fourth node;
an eighth transistor coupled between the gate of the third transistor and the third node;
a ninth transistor coupled between the gate of the fifth transistor and the fourth node;
a tenth transistor between a node of a first potential and the first node;
an eleventh transistor between the second node and a node of a second potential lower than the first potential; and
a control circuit that
receives a first signal and a second signal,
includes a delay circuit that outputs a third signal that is a delayed version of the second signal,
applies a fourth signal having a level based on the first signal, the second signal, and the third signal to a gate of the eleventh transistor, and
applies a fifth signal having a level based on the first signal and the second signal to a gate of the tenth transistor.

10. The memory device according to claim 9, wherein the fifth signal is not based on the first signal.

11. The memory device according to claim 9, wherein the control circuit includes
- a first circuit that outputs the fifth signal having a second level while both of the second signal and the third signal have a first level, and
- a second circuit that outputs the fourth signal having a fourth level while the first signal has a third level and one of the second signal and the third signal has the first level.

12. The memory device according to claim 11, wherein the first level is a high level,
the second level is a low level,
the third level is a low level, and
the fourth level is a high level.

13. The memory device according to claim 11, wherein the fifth signal is not based on the first signal.

14. The memory device according to claim 11, wherein the first circuit includes a NAND gate,
the NAND gate receives the second signal and the third signal and outputs the fifth signal,
the second circuit includes a first NOR gate and a second NOR gate,
the first NOR gate receives the second signal and the third signal and outputs a sixth signal, and
the second NOR gate receives the sixth signal and the first signal and outputs the fourth signal.

15. The memory device according to claim 14, wherein the first level is a high level,
the second level is a low level,
the third level is a low level, and
the fourth level is a high level.

* * * * *